US006215110B1

(12) United States Patent
Jones

(10) Patent No.: US 6,215,110 B1
(45) Date of Patent: Apr. 10, 2001

(54) FORMABLE HEATER TAPE ASSEMBLY

(75) Inventor: Thaddeus M. Jones, Bremen, IN (US)

(73) Assignee: MSX, Inc., South Bend, IN (US)

( * ) Notice: Subject to any disclaimer, the term of this patent is extended or adjusted under 35 U.S.C. 154(b) by 0 days.

(21) Appl. No.: 09/553,273

(22) Filed: Apr. 20, 2000

Related U.S. Application Data

(63) Continuation of application No. 09/022,236, filed on Feb. 11, 1998, now Pat. No. 6,057,531.

(51) Int. Cl.[7] ................................ H05B 3/44; H01L 3/06

(52) U.S. Cl. ........................................ 219/544; 338/210

(58) Field of Search ............................ 219/544; 338/210, 338/226, 212, 214, 279, 281, 293, 333; 405/234; 165/104.15; 174/15.2; 428/343, 354

(56) References Cited

U.S. PATENT DOCUMENTS

| | | | |
|---|---|---|---|
| 2,419,655 | 4/1947 | Reiser | 219/46 |
| 2,710,909 | 6/1955 | Logan et al. | 219/46 |
| 2,722,597 | 11/1955 | Steiner | 219/46 |
| 2,982,932 | 5/1961 | Morey | 338/212 |
| 2,998,840 | 9/1961 | Davis | 154/2.6 |
| 3,386,846 | 6/1968 | Lones | 117/11 |
| 3,537,053 | 10/1970 | Snoberger et al. | 338/25 |
| 3,947,896 | 4/1976 | Taylor | 2/217 |
| 4,037,083 | 7/1977 | Leavines | 219/552 |
| 4,072,921 | 2/1978 | Sacchetti | 338/61 |
| 4,133,310 | 1/1979 | Lloyd et al. | 128/156 |
| 4,251,712 | 2/1981 | Parr | 219/203 |
| 4,307,290 | 12/1981 | Bloore et al. | 219/528 |
| 4,390,576 | 6/1983 | Hutter | 428/40 |
| 4,605,992 | 8/1986 | Cover | 362/147 |
| 4,673,801 | 6/1987 | Leary et al. | 219/544 |
| 5,111,025 | 5/1992 | Barma et al. | 219/217 |
| 5,155,800 | 10/1992 | Rezabek et al. | 392/503 |
| 5,213,750 | 5/1993 | Knapp et al. | 264/280 |
| 5,380,981 | 1/1995 | Feldman et al. | 219/219 |
| 5,477,033 | 12/1995 | Bergholtz | 219/549 |
| 5,846,651 | 12/1998 | Nakai et al. | 428/343 |

*Primary Examiner*—Teresa Walberg
*Assistant Examiner*—Daniel Robinson
(74) *Attorney, Agent, or Firm*—Taylor & Aust, P.C.

(57) ABSTRACT

A heater tape assembly for heating an object to be heated includes an elongate first tape, an elongate second tape and at least one heater wire. The elongate first tape has a pair of opposing side edges and a first surface extending between the side edges. The first tape also has a plurality of first notches which extend into the first surface from a respective side edge thereof. The elongate second tape has a pair of opposing side edges and a pair of opposing second and third flat surfaces extending between the side edges. The second tape also has a plurality of second notches which extend into the second and third flat surfaces from a respective side edge thereof. The second notches in the second tape are substantially aligned with respective first notches in the first tape. The second flat surface is bonded with the first surface of the first tape. The third flat surface has an adhesive thereon for bonding to the object to be heated. The at least one heater wire is interposed between the first surface of the first tape and the second surface of the second tape. The notches in the first and second tapes allow the heater tape assembly to be bent in a plane substantially parallel to the first and second flat surfaces.

18 Claims, 3 Drawing Sheets

FORMABLE HEATER TAPE ASSEMBLY

This application is a continuation of application Ser. No. 09/022,236 filed Feb. 11, 1998 now U.S. Pat. No. 6,057,531.

BACKGROUND OF THE INVENTION

1. Field of the Invention

The present invention relates to a heater tape assembly.

2. Description of the Related Art

Heater wire for heating an object to be heated, e.g., an antenna reflector, may be attached in a desired pattern to a relatively large sheet of thermally conductive foil using an adhesive. The foil is typically cut to a desired shape and the heater wire is laid in a serpentine or other desired pattern on the foil. An adhesive on one side of the foil holds the heater wire in place and also attaches the foil to an object to be heated. Such an assembly requires that the foil be precut to the shape of the area to which the foil is to be applied on the object to be heated. Typically, different foils with different shapes are required to be used with different objects to be heated. This therefore in turn requires that a relatively large inventory of foils with different shapes be maintained.

What is needed in the art is a heater assembly which allows a user to apply a heater wire to an object to be heated with virtually any desired pattern and without precutting the heater assembly.

SUMMARY OF THE INVENTION

The present invention provides a heater tape assembly with a heater wire disposed between two flat tapes which are bonded together and have a plurality of notches in the side edges thereof to allow the heater tape assembly to bent in a plane parallel to the flat tapes.

The invention comprises, in one form thereof, a heater tape assembly for heating an object to be heated. An elongate first tape has a pair of opposing side edges and a first surface extending between the side edges. The first tape also has a plurality of first notches which extend into the first surface from a respective side edge thereof. An elongate second tape has a pair of opposing side edges and a pair of opposing second and third flat surfaces extending between the side edges. The second tape also has a plurality of second notches which extend into the second and third flat surfaces from a respective side edge thereof. The second notches in the second tape are substantially aligned with respective first notches in the first tape. The second flat surface is bonded with the first surface of the first tape. The third flat surface has an adhesive thereon for bonding to the object to be heated. At least one heater wire is interposed between the first surface of the first tape and the second surface of the second tape. The notches in the first and second tapes allow the heater tape assembly to be bent in a plane substantially parallel to the first and second flat surfaces.

An advantage of the present invention is that the heater tape assembly may be bent to form to almost any desired surface with any desired shape.

Another advantage is that the opposite ends of the heater wire may be connected with a source of power at a common end of the heater wire assembly.

Yet another advantage is that the notches may be formed in the side edges of the heater tape assembly with a number of different shapes and still provide the desired functionality of allowing the heater tape assembly to be bent in a plane parallel to the flat surfaces of the tapes.

Still another advantage is that the notches may be kiss cut in the side edges of the heater tape assembly without cutting the backing, thereby allowing the backing to be easily removed without tearing.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

Corresponding reference characters indicate corresponding parts throughout the several views. The exemplifications set out herein illustrate one preferred embodiment of the invention, in one form, and such exemplifications are not to be construed as limiting the scope of the invention in any manner.

DETAILED DESCRIPTION OF THE INVENTION

Figure 1:
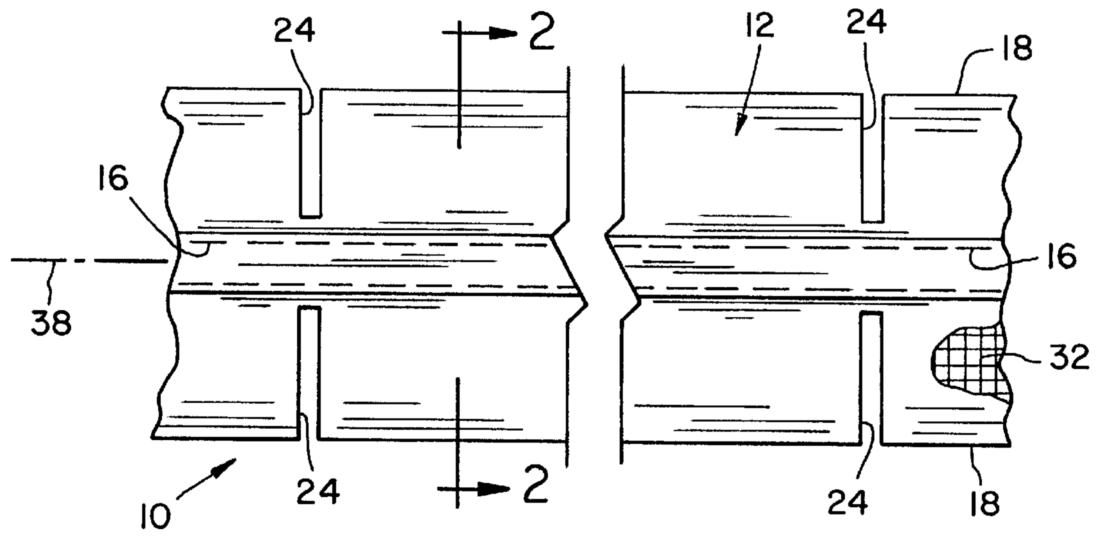
FIG. 1 is a fragmentary, top view of one embodiment of the heater tape assembly of the present invention with notches in the form of slits.
Figure 2:
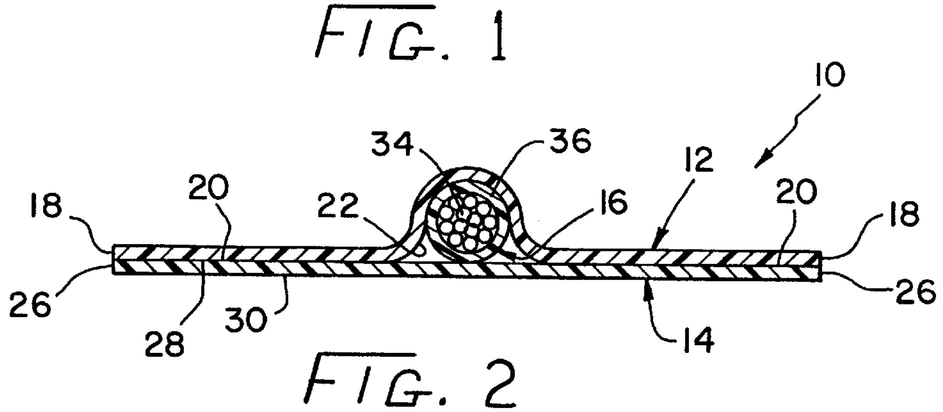
FIG. 2 is a side, sectional view taken along line 2—2 in FIG. 1.
Figure 3:
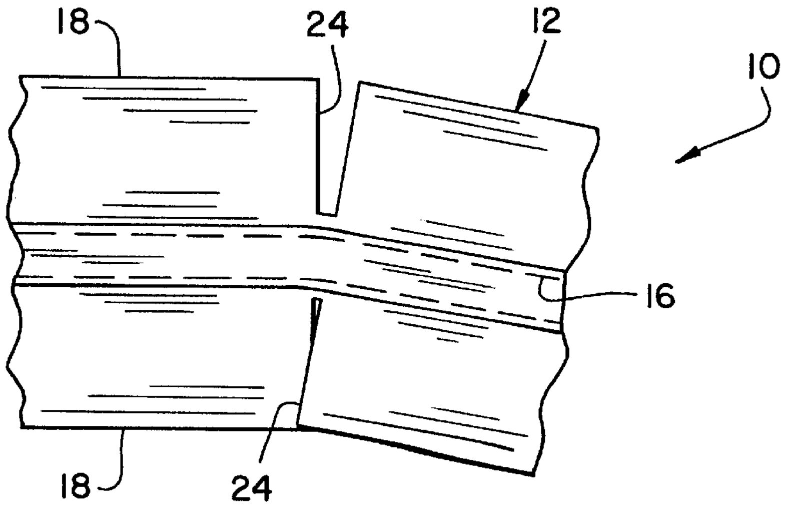
FIG. 3 is a fragmentary, top view of the heater tape assembly shown in FIGS. 1 and 2, illustrating bending of the heater tape assembly and corresponding relative movement of the notches.

Referring now to the drawings, and more particularly to FIGS. 1–3, there is shown an embodiment of a heater tape assembly 10 of the present invention. Heater tape assembly 10 includes an elongate first tape 12, an elongate second tape 14 and at least one heater wire 16.

First tape 12 includes a pair of opposing side edges 18 with a first surface 20 extending therebetween. First surface 20 includes an arcuate center portion 22 located between two flat portions of first surface 20 on either side thereof which extend to opposing side edges 18. First tape 12 includes a plurality of first notches 24 which extend into first flat surface 20 from a respective side edge 18. In the embodiment shown, each first notch 24 is in the form of a slit which extends from a respective side edge 18. Each side edge 18 includes a plurality of slits 24 which are spaced apart along a longitudinal extension of heater tape assembly 10. Each slit 24 in a side edge 18 is disposed in substantial alignment with a slit 24 in an opposing side edge 18.

Second tape 14 includes a pair of opposing side edges 26 and a pair of opposing second and third flat surfaces 28 and 30 extending therebetween. Second flat surface 28 is bonded with first flat surface 20 of first tape 12. More particularly, first flat surface 20 and/or second flat surface 28 includes an adhesive thereon allowing first tape 12 and second tape 14 to be bonded together. Opposing side edges 26 of second tape 14 substantially align with opposing side edges 18 of first tape 12. Second tape 14 includes a plurality of second notches (not numbered) which extend into second and third flat surfaces 28 and 30, respectively, from a corresponding side edge 26. The second notches formed in second tape 14 are disposed in substantial alignment with respective first notches in first tape 12. That is, the second notches in second tape 14 lie immediately under and in alignment with first notches 24 of tape 12 shown in FIG. 1. Third flat surface 30 includes a thin layer of adhesive thereon for bonding to the object to be heated, such as an antenna reflector or pipe (not shown).

First tape 12 and second tape 14 may be formed from any suitable material. In the embodiment shown in FIGS. 1–3, first tape 12 and second tape 14 are each constructed from metallic foil which provides a relatively high strength and allows good thermal conduction from heater wire 16 to the object to be heated. The metallic foil may include reinforcing fibers therein, such as fiberglass reinforcing fibers 32 shown partially in FIG. 1.

Heater wire 16 is interposed between first surface 20 of first tape 12 and second surface 28 of second tape 14. More particularly, heater wire 16 is at least partially surrounded by arcuate center portion 22 of first surface 20 and is interposed between arcuate center portion 22 and second flat surface 28 of second tape 14. In the embodiment shown, heater wire 16 includes a plurality of wire strands 34 which are encased by an extruded, plastic layer of insulation 36. Heater wire 16 is not in communication with any of first notches 24 formed in first tape 12 or the second notches formed in second tape 14. In other words, each pair of aligned notched in first tape 12 and second tape 14 extending from a side edge 18, 26 does not extend to arcuate center portion 22 or heater wire 16. Heater wire 16 is therefore prevented from directly contacting a user or other object. In the embodiment shown, heater tape assembly 10 has a longitudinal axis 38 and heater wire 16 is disposed substantially coincident with longitudinal axis 38.

First notches 24 formed in first tape 12 and the correspondingly aligned notches formed in second tape 14 allow first tape 12 and second tape 14 to be bent in a plane substantially parallel to first surface 20 and second flat surface 28. More particularly, and referring to FIG. 3, notches 24 formed in first tape 12 and the correspondingly aligned notches formed in second tape 14 include opposing side walls (not numbered) which move relative to each other when heater tape assembly 10 is bent in the plane parallel to second flat surface 28. As shown in FIG. 3, a notch on the side toward which heater tape assembly 10 is bent closes or overlaps, while the notch on the opposite side from which heater tape assembly 10 is bent opens. Without using notches in first tape 12 and second tape 14, the tapes may crumple on the side toward which the heater tape assembly is bent and tear on the side away from which the heater tape assembly is bent. Such crumpling or tearing of the tapes is obviously not desirable. Depending upon the extent to which heater tape assembly is bent, a notch on the side toward which the heater tape assembly 10 is bent may substantially close, or may even overlap as shown in FIG. 3.

In the embodiment of heater tape assembly 10 shown in FIGS. 1–3, first tape 12 and second tape 14 have a width extending between opposing side edges 18 and 26 of between approximately 1 to 2.5 inches. However, it will be appreciated that a particular width may be selected depending upon a specific application such that heater tape assembly 10 is allowed to bend or flex by allowing relative movement of notches 24.

Figure 4:
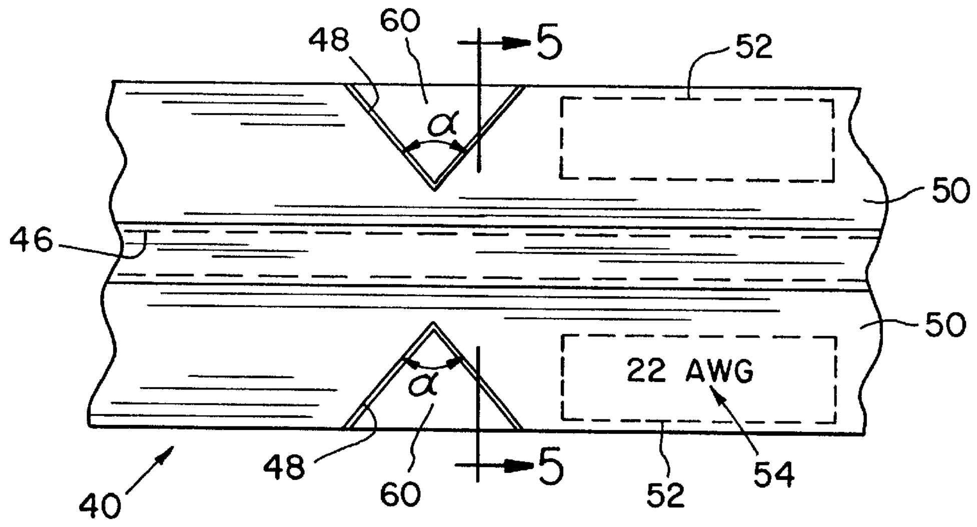
FIG. 4 is a fragmentary, top view of another embodiment of the heater tape assembly of the present invention with notches in the form of V-shaped notches.
Figure 5:
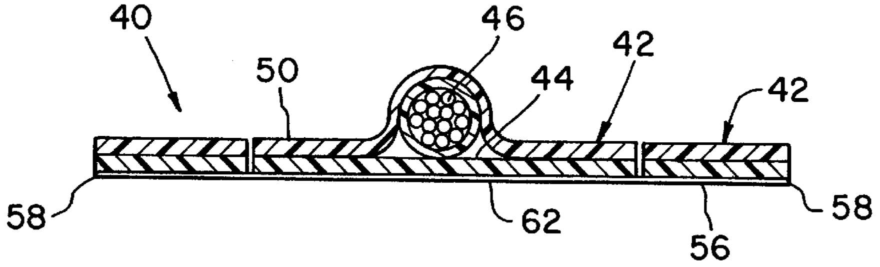
FIG. 5 is a side, sectional view taken along line 5—5 in FIG. 4.
Figure 6:
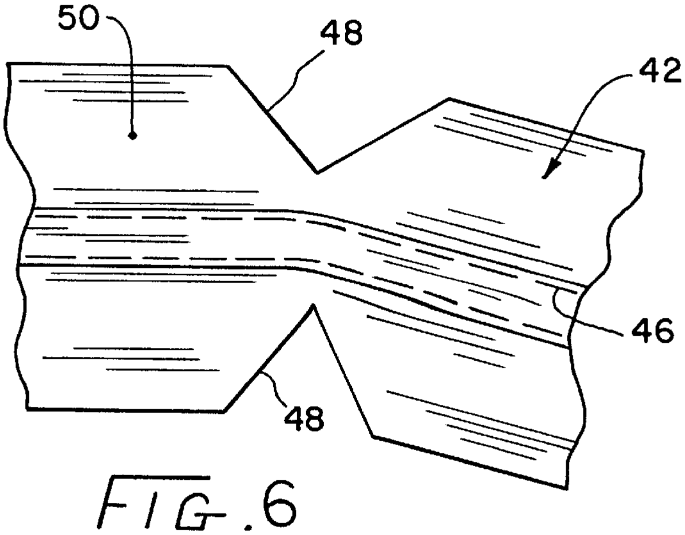
FIG. 6 is a fragmentary, top view of the heater tape assembly shown in FIGS. 4 and 5 with the backing removed, illustrating bending of the heater tape assembly and corresponding relative movement of the notches.

Referring now to FIGS. 4–6, there is shown another embodiment of a heater tape assembly 40 of the present invention, including a first tape 42, second tape 44 and heater wire 46 which are similar to first tape 12, second tape 14 and heater wire 16 shown in the embodiment of heater tape assembly 10 in FIGS. 1–3. However, first tape 42 and second tape 44 each include a plurality of notches therein in the form of V-shaped notches 48, rather than slits 24 as shown in FIGS. 1–3. When heater tape assembly 40 is disposed substantially straight, as shown in FIG. 4, each V-shaped notch 48 of first tape 42 and second tape 44 has opposing side walls (not numbered) which are disposed at an angle $\alpha$ therebetween of between approximately 80° to 100°. This angular relationship has been found to be adequate to allow proper closing of one notch in a side edge and opening of a corresponding notch in an opposing side edge during bending of heater tape assembly 40 as shown in FIG. 6.

First tape 42 of heater tape assembly 40 is also provided with at least one outside flat surface 50 having a flat display area 52 thereon. Flat display area 52 provides an area for displaying visual indicia 54 thereon. The visual indicia may, e.g., correspond to specifications or data associated with heater wire 46 within heater tape assembly 40. To wit, it will be appreciated that after heater wire 46 is interposed between and bonded to first tape 42 and second tape 44, data which may have been printed on heater wire 46 is no longer visible to a user. The visual indicia may correspond, e.g., to the wire size, voltage rating or other data of interest to a user. Display area 52 allows heater wire 46 to be entirely covered, while at the same time allowing the corresponding technical data to be displayed as visual indicia 54 therein.

Heater tape assembly 40 also includes a backing 56 having a pair of opposing side edges 58 which are disposed adjacent to opposing side edges of first tape 42 and second tape 44. Backing 46 has a fourth flat surface (not numbered) extending between opposing side edges 58 and adjacent to second tape 44. The fourth flat surface of backing 56 is detachably bonded with the underlying or third flat surface 62 of second tape 44, whereby backing 56 may be easily pulled apart from second tape 44. Backing 56 does not include any notches therein, as does first tape 42 and second tape 44.

Notches 48 within heater tape assembly 40 are formed by the process of kiss cutting each of first tape 42 and second tape 44 without cutting backing 56 (see FIG. 5). That is, after first tape 42, second tape 44 and backing 56 are attached to each other, V-shaped notches 48 are formed by kiss cutting first tape 42 and second tape 44 without the cutter penetrating backing 56. In this manner, each triangular piece 60 which is complimentary to each V-shaped notch 48 remains intact with backing 56. When a user desires to use heater tape assembly 40, backing 56, with triangular pieces 60 attached thereto, are separated and detached from second tape 44 and discarded. Heater tape assembly 40 may then be applied to the object to be heated with an adhesive which covers third flat surface 62 of second tape 44.

Figure 7:
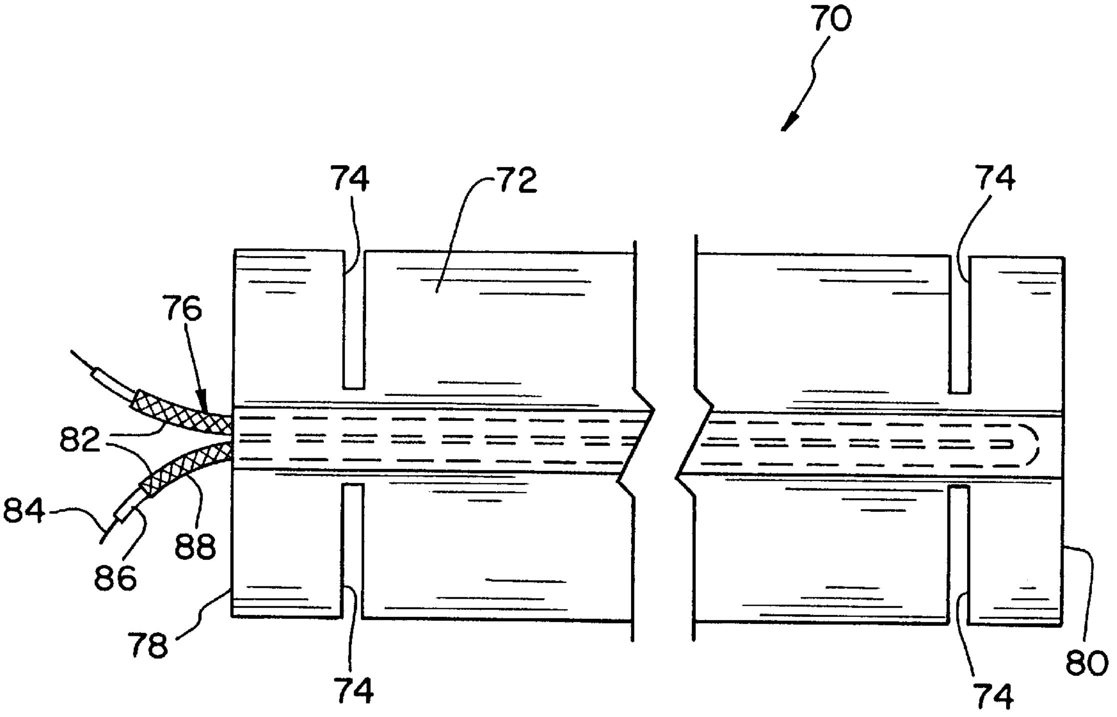
FIG. 7 is a fragmentary, top view of another embodiment of the heater tape assembly of the present invention with a single heater wire looping back on itself.

FIG. 7 illustrates yet another embodiment of a heater tape assembly 70 of the present invention. Heater tape assembly 70 includes a first tape 72, a second tape thereunder (not numbered) and a plurality of notches in the form of slits 74 extending through both first tape 72 and the second tape. The plurality of notches such as slits 74 can be formed, e.g., from a stamping process or using a carpet knife or pair of scissors. The primary difference between heater tape assembly 10 shown in FIGS. 1–3 and heater tape assembly 70 shown in FIG. 7 is that heater tape assembly 70 includes a single heater wire 76 which loops back on itself and has opposing ends 82 which terminate adjacent to a common end 78 of first tape 72 and the second tape. More particularly, heater wire 76 extends from a first common end 78 to a second common end 80 of heater tape assembly 70 and loops back on itself near common end 80 such that opposing wire ends 82 terminate at the same common end 78. Heater wire 76, in the embodiment shown, is in the form of a shielded heater wire having a core conductor 84, a layer of extruded plastic insulation 86 around core 84, and a grounding shield 88 around layer of insulation 86. By providing opposite wire ends 82 of heater wire 76 which terminate at a common end 78 of heater tape assembly 70, heater wire 76 may be easily connected to the line and neutral sides of a source of power. In the embodiment shown in FIG. 7, the looping portions of heater wire 76 lie adjacent to each other. However, it is also possible to twist the looping portions of heater wire 76 within first tape 72 such that any fields produced by heater wire 76 are substantially canceled. Moreover, it is also possible to place a looped and insulated core conductor within a single grounding shield extending through heater tape assembly 70.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A heater tape assembly for heating an object to be heated, said heater tape assembly comprising:

an elongate first tape having a pair of opposing side edges and a first surface extending between said side edges, said first tape having a plurality of first notches which extend into said first surface from a respective said side edge, said first tape including an outside flat surface opposite said first surface, said outside flat surface having a flat display area and visual indicia disposed within said flat display area;

an elongate second tape having a pair of opposing side edges and a pair of opposing second and third flat surfaces extending between said side edges, said second tape having a plurality of second notches which extend into said second and third flat surfaces from a respective said side edge, said second notches in said second tape being substantially aligned with respective said first notches in said first tape, said second flat surface being bonded with said first surface of said first tape, said third flat surface having an adhesive thereon for bonding to the object to be heated;

at least one heater wire interposed between said first surface of said first tape and said second surface of said second tape; and a backing having a pair of opposing side edges and a fourth flat surface extending between said side edges, said side edges of said backing being adjacent to said side edges of said first and second tapes, said fourth flat surface being detachably bonded with said third flat surface of said second tape, said backing including an absence of notches in said side edges;

wherein said heater tape assembly is formed by the process of kiss cutting said notches in said first and second tapes while said backing is bonded to said second tape, said kiss cutting being performed without cutting said notches in said backing.

2. The heater tape assembly of claim 1, wherein said notches in said first and second tapes define a means for allowing said heater tape assembly to be bent in a plane substantially parallel to said first surface and said second flat surface.

3. The heater tape assembly of claim 1, wherein said heater tape assembly has a longitudinal axis and said at least one heater wire is disposed substantially coincident with said longitudinal axis.

4. The heater tape assembly of claim 3, wherein said at least one heater wire is not in communication with any of said notches.

5. The heater tape assembly of claim 4, wherein said heater tape assembly has a width extending between said side edges of between approximately 1 to 2.5 inches.

6. The heater tape assembly of claim 1, wherein said at least one heater wire comprises one heater wire.

7. The heater tape assembly of claim 6, wherein said first tape and said second tape have a common end and said one heater wire has opposing ends, said heater wire looping back on itself such that both of said heater wire ends terminate adjacent to said common end of said first and second tapes.

8. The heater tape assembly of claim 1, wherein each of said notches in said first and second tapes comprise slits.

9. The heater tape assembly of claim 1, wherein each of said notches in said side edges of said first and second tapes are spaced apart along a longitudinal extension of said first and second tapes, each said notch in one said side edge being aligned with a notch in an opposing side edge.

10. The heater tape assembly of claim 1, wherein each of said first and second tapes are metallic foil tapes.

11. A heater tape assembly for heating an object to be heated, said heater tape assembly comprising:

an elongate first tape having a pair of opposing side edges and a first surface extending between said side edges, said first tape having a plurality of first notches which extend into said first surface from a respective said side edge;

an elongate second tape having a pair of opposing side edges and a pair of opposing second and third flat surfaces extending between said side edges, said second tape having a plurality of second notches which extend into said second and third flat surfaces from a respective said side edge, said second notches in said second tape being substantially aligned with respective said first notches in said first tape, said second flat surface being bonded with said first surface of said first tape, said third flat surface having an adhesive thereon for bonding to the object to be heated, said first and second tapes being metallic foil tapes having reinforcing fibers disposed within said metallic foil tapes;

at least one heater wire interposed between said first surface of said first tape and said second surface of said second tape; and a backing having a pair of opposing side edges and a fourth flat surface extending between said side edges, said side edges of said backing being adjacent to said side edges of said first and second tapes, said fourth flat surface being detachably bonded with said third flat surface of said second tape, said backing including an absence of notches in said side edges;

wherein said heater tape assembly is formed by the process of kiss cutting said notches in said first and second tapes while said backing is bonded to said second tape, said kiss cutting being performed without cutting said notches in said backing.

12. The heater tape assembly of claim 11, wherein said reinforcing fibers comprise fiberglass reinforcing fibers.

13. The heater tape assembly of claim 1, wherein at least one of said first surface of said first tape and said second flat surface of said second tape includes an adhesive thereon for bonding said first surface and second flat surface together.

14. The heater tape assembly of claim 1, wherein each said heater wire comprises a core conductor, a layer of insulation around said core conductor and a grounding shield around said layer of insulation.

15. A wire placement assembly comprising:

an elongate first tape having a pair of opposing side edges and a first surface extending between said side edges, said first tape having a plurality of substantially planar first non-rectangular notches which extend into said first surface from a respective said side edge, each said first non-rectangular notch extending in a direction substantially parallel to said first surface;

an elongate second tape having a pair of opposing side edges and a pair of opposing second and third flat surfaces extending between said side edges, said second tape having a plurality of substantially planar second non-rectangular notches which extend into said second and third flat surfaces from a respective said side edge, each said second non-rectangular notch extending in a direction substantially parallel to each of said second and third flat surfaces, said second non-rectangular notches in said second tape being substantially aligned with respective said first notches in said first tape, said second flat surface being bonded with said first surface of said first tape, said third flat surface having an adhesive thereon for bonding to an object; and at least one wire interposed between said first surface of said first tape and said second surface of said second tape.

16. The wire placement assembly of claim 15, wherein said at least one wire comprises at least one heater wire configured for heating the object.

17. The wire placement assembly of claim 15, wherein said first non-rectangular notches are V-shaped.

18. The wire placement assembly of claim 17, wherein said second non-rectangular notches are V-shaped.

* * * * *

UNITED STATES PATENT AND TRADEMARK OFFICE

CERTIFICATE OF CORRECTION

PATENT NO. : 6,215,110 B1
DATED : April 10, 2001
INVENTOR(S) : Thaddeus M. Jones It is certified that error appears in the above-identified patent and that said Letters Patent is hereby corrected as shown below:

Title page,
Item [56], under "References Cited", add -- 2,786,125 3/1957 Drugmano et al. 219/38 -- therefor.

Signed and Sealed this

Sixteenth Day of April, 2002

Attest:

JAMES E. ROGAN
*Director of the United States Patent and Trademark Office*

*Attesting Officer*